United States Patent
Lin

(10) Patent No.: US 10,789,163 B2
(45) Date of Patent: *Sep. 29, 2020

(54) DATA STORAGE DEVICE WITH RELIABLE ONE-SHOT PROGRAMMING AND METHOD FOR OPERATING NON-VOLATILE MEMORY

(71) Applicant: Silicon Motion, Inc., Jhubei, Hsinchu County (TW)

(72) Inventor: Wen-Sheng Lin, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/229,073

(22) Filed: Dec. 21, 2018

(65) Prior Publication Data
US 2019/0196960 A1 Jun. 27, 2019

(30) Foreign Application Priority Data
Dec. 27, 2017 (TW) .............................. 106145988 A

(51) Int. Cl.
| | |
|---|---|
| *G06F 12/02* | (2006.01) |
| *G06F 3/06* | (2006.01) |
| *G06F 12/00* | (2006.01) |
| *G06F 11/10* | (2006.01) |
| *G11C 16/10* | (2006.01) |
| *G06F 11/07* | (2006.01) |

(52) U.S. Cl.
CPC .......... *G06F 12/0246* (2013.01); *G06F 3/064* (2013.01); *G06F 3/0604* (2013.01); *G06F 3/0679* (2013.01); *G06F 11/07* (2013.01); *G06F 11/1068* (2013.01); *G06F 12/00* (2013.01); *G11C 16/10* (2013.01)

(58) Field of Classification Search
CPC ................................................... G06F 12/0246
See application file for complete search history.

(56) References Cited

U.S. PATENT DOCUMENTS

| | | | |
|---|---|---|---|
| 6,988,175 B2* | 1/2006 | Lasser ................. | G11C 11/5628 365/228 |
| 2015/0332772 A1 | 11/2015 | Kim et al. | |
| 2016/0124820 A1* | 5/2016 | Lin ....................... | G06F 3/0619 714/6.12 |
| 2018/0157428 A1* | 6/2018 | Li ......................... | G06F 11/108 |
| 2018/0302104 A1* | 10/2018 | Bhatia ................. | G06F 11/1072 |

* cited by examiner

*Primary Examiner* — Rebecca E Song
*Assistant Examiner* — Won Tae C Kim
(74) *Attorney, Agent, or Firm* — McClure, Qualey & Rodack, LLP

(57) ABSTRACT

A power recovery technique for a data storage device having a non-volatile memory and a control unit is shown. The non-volatile memory is programmed using one-shot programming, wherein N pages are programmed in one round of one-shot programming and N is a number greater than one. A control unit corrects the final page indicator of an active block of the non-volatile memory in a power recovery procedure to cope with a sudden power-off event, to point the final page indicator to a final page among N pages of one round of one-shot programming.

18 Claims, 5 Drawing Sheets

US 10,789,163 B2

DATA STORAGE DEVICE WITH RELIABLE ONE-SHOT PROGRAMMING AND METHOD FOR OPERATING NON-VOLATILE MEMORY

CROSS REFERENCE TO RELATED APPLICATIONS

This Application claims priority of Taiwan Patent Application No. 106145988, filed on Dec. 27, 2017, the entirety of which is incorporated by reference herein.

BACKGROUND OF THE INVENTION

Field of the Invention

The present invention relates to data storage devices and methods for operating non-volatile memory.

Description of the Related Art

There are various forms of non-volatile memory (NVM) for long-term data retention, such as flash memory, magnetoresistive RAM, ferroelectric RAM, resistive RAM, spin transfer torque-RAM (STT-RAM), and so on.

Write operations on a non-volatile memory may be interrupted by sudden power-off events. In order to guarantee data reliability, the power recovery procedure for data storage device is important in the technical field.

BRIEF SUMMARY OF THE INVENTION

According to an exemplary embodiment of the disclosure, the size of one round of one-shot programming is considered in a power recovery procedure to enhance data reliability.

A data storage device in accordance with an exemplary embodiment of the present invention has a non-volatile memory and a control unit. The non-volatile memory is programmed using one-shot programming, wherein N pages are programmed in one round of one-shot programming and N is a number greater than one. The control unit corrects a final page indicator of an active block of the non-volatile memory in a power recovery procedure to cope with a sudden power-off event, to point the final page indicator to a final page among N pages of one round of one-shot programming.

In another exemplary embodiment, a method for operating a non-volatile memory is disclosed, which includes the following steps: programming a non-volatile memory using one-shot programming, wherein N pages are programmed in one round of one-shot programming and N is a number greater than one; and correcting a final page indicator of an active block of the non-volatile memory in a power recovery procedure to cope with a sudden power-off event, to point the final page indicator to a final page among N pages of one round of one-shot programming.

In an exemplary embodiment, error checking and correction is performed on N pages of one round of one-shot programming that include the final page indicated by the final page indicator. When the error checking and correction fails, correcting the final page indicator to a final page among N pages of a former round of one-shot programming.

In an exemplary embodiment, after determining the final page indicator, it is further determined whether the N pages of one round of one-shot programming that include the final page indicated by the final page indicator are affected by the sudden power-off event, and the affected N pages are moved to a reliable area.

In an exemplary embodiment, when the final page indicated by the final page indicator is not followed by an empty page, it is determined that the N pages of one round of one-shot programming that include the final page indicated by the final page indicator are not affected by the sudden power-off event and no affected N pages need to be moved to a reliable area.

In an exemplary embodiment, when mapping information of the N pages of one round of one-shot programming that include the final page indicated by the final page indicator has been sealed, it is determined that the N pages of one round of one-shot programming that include the final page indicated by the final page indicator are not affected by the sudden power-off event and no affected N pages need to be moved to a reliable area.

In an exemplary embodiment, after determining the final page indicator, it is further determined whether the N pages of one round of one-shot programming that include the final page indicated by the final page indicator has been invalidated by updated data or data movement, and thereby invalid data is not moved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
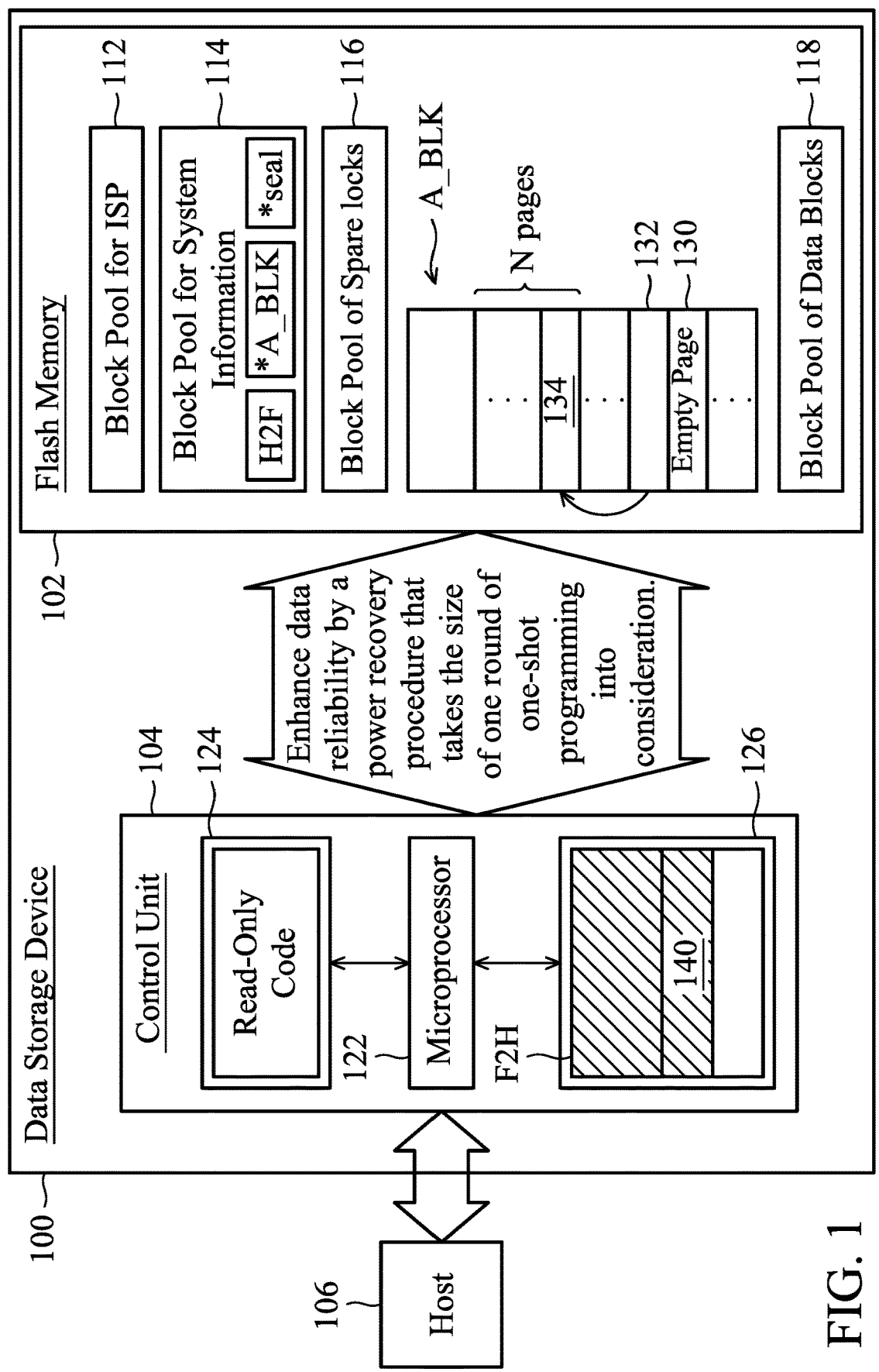
FIG. 1 is a block diagram illustrating a data storage device 100 in accordance with an exemplary embodiment of the present invention, which includes a flash memory 102 and a control unit 104.

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive RAM, a ferroelectric RAM, a resistive RAM, a spin transfer torque-RAM (STT-RAM) and so on. A non-volatile memory may be used to implement a data storage device or a data center. The following discussion is regarding flash memory in particular as an example.

A flash memory is often used as a storage medium in today's data storage devices, for implementations of a memory card, a USB flash device, an SSD and so on. In another exemplary embodiment, a flash memory is packaged with a controller to form a multiple-chip package and named eMMC.

A data storage device using a flash memory as a storage medium can be applied in a variety of electronic devices, including a smartphone, a wearable device, a tablet computer, a virtual reality device, etc. A calculation module of an electronic device may be regarded as a host that operates a data storage device equipped on the electronic device to access a flash memory within the data storage device.

A data center may be built with flash memories as the storage medium. For example, a server may operate an array of SSDs to form a data center. The server may be regarded as a host that operates the SSDs to access the flash memories within the SSDs.

The host distinguishes the flash memory storage contents by logical addresses (for example, according to a logical block address LBA or a global host page number GHP, etc.). The physical space of a flash memory is divided into a plurality of blocks, storing pages of data received from the host. In order to optimize the storage of the flash memory, the physical space of the flash memory is dynamically allocated to correspond to the host-identified logical addresses. The mapping between logical addresses and storage space needs to be properly managed.

Various operations of flash memory need to refer to or may change the mapping information. For example, the reading of flash memory needs to refer to the mapping information, and the writing of flash memory needs to update the mapping information. To reuse a storage space of a flash memory, the dirty space has to be erased in block units. Since there is an upper limit for the erasures that each block can withstand, the issue of wear leveling needs to be considered in flash memory operations. In addition, data updating is not rewriting the same space. The newer version of data is written to a spare space and the old data is regarded as invalid. A block may sporadically retain valid data, so the demand for garbage collection is correspondingly generated. Sporadic valid data retained by a block is moved to a spare space by garbage collection. The block with only invalid data left can be erased and released as a spare block waiting to be reused. The techniques of wearing leveling and garbage collection involve mapping information management. The management of mapping information is an important issue in the technical field.

There are many ways to manage mapping information. For an active block (currently used in the reception of data from the host, or as the destination block for garbage collection), the dynamically-changed mapping information may be managed by a mapping table F2H. The mapping table F2H is indexed along physical addresses to list the corresponding logical addresses. The mapping table F2H needs to be reversed for updating another mapping table H2F. The mapping table H2F provides a mapping information query mechanism with logical addresses as the searching index. The mapping table H2F needs to be backed up in a non-volatile manner (e.g. on the flash memory); that is, the mapping information of the small table F2H needs to be sealed to the large table H2F. The mapping table F2H may be also stored in the flash memory for the subsequent garbage collection operations to determine whether the pages of the active block are valid or invalid. In particular, the logical address corresponding to each page of the active block may be recorded as metadata for each page. In cases where the mapping table F2H fails to be sealed to the mapping table H2F due to a sudden power-off event, the mapping information is rebuilt by the scanning of the metadata.

When a write operation is interrupted by a sudden power-off event, the write data may be unreliable and the reliability of the adjacent data may be affected. For example, the data that can be correctly read at the moment of power recovery may degrade to unreadable in the near future. It is important to enhance data reliability by a power recovery procedure.

In the prevent invention, the flash memory is implemented by a high-density storage technology such as using multi-level cells (MLCs) or triple-level cells (TLCs) to store data. The storage density of each storage unit, therefore, is increased. Compared to a single-level cell (SLC), twice amount of data is stored in an MLC, and three times of data is stored in a TLC. According to the present invention, the high-density storage device may be programmed by a one-shot programming technique. Multiple pages sharing the same storage unit are programmed together using one-shot programming. A flash memory may be read/write in a single-plane mode, double-plane mode or a mode associated with the parallel operations on more planes. According to the mode setting, the number of planes tied to the same read/write operation is determined, which may be just one single plane, two planes, or more than two planes. N pages are programmed together using one-shot programming, wherein N is an integer greater than 1 and may be the product of Level # (the number of data pages sharing the same storage unit) and Plane # (the number of planes depending on the mode setting); that is, N=Level #*Plane #. A 3D MLC flash memory is discussed as an example. Each storage unit is allocated to store two pages of data. When writing data in a double-plane mode, the value of N is 4 (=2×2). In another exemplary embodiment, a multi-chip enabling function is adopted. The number of storage areas accessed in an interleaving way according to a chip enable signal (CE signal) is CE #. The value of N may be Level #*Plane #*CE #. In the present invention, a power recovery procedure with the one-shot programming feature taken into consideration is provided.

FIG. 1 is a block diagram illustrating a data storage device 100 in accordance with an exemplary embodiment of the present invention, which includes a flash memory 102 and a control unit 104. The control unit 104 operates the flash memory 102 to respond to the requests from a host 106. The storage space of the flash memory 102 may be allocated for various purposes. A block pool 112 stores in-system code (ISP). A block pool 114 stores system information. An active block A_BLK is selected from a block pool 116 of spare blocks. The active block A_BLK may be utilized to receive data in response to write requests from the host 106 or as a destination block of garbage collection. The active block A_BLK is programmed using one-shot programming. In cases where the flash memory 102 stores data by SLCs and is operated in a double-plane mode, two pages are programmed to the active block A_BLK together corresponding to each one-shot programming operation. In cases where the flash memory 102 stores data by MLCs and is operated in a 1-plane mode, two pages are programmed to the active block A_BLK together in each one-shot programming operation. In cases where the flash memory 102 stores data by MLCs and is operated in a double-plane mode, four pages are programmed to the active block A_BLK together in each one-shot programming operation. In cases where the flash memory 102 stores data by TLCs and is operated in a 1-plane mode, three pages are programmed to the active block A_BLK together in each one-shot programming operation. In cases where the flash memory 102 stores data by TLCs and is operated in a double-plane mode, six pages are programmed to the active block A_BLK together in each one-shot programming operation. The active block A_BLK is pushed to a block pool 118 of data blocks when finishing the data reception. The block pool 114 of system information may store a mapping table H2F, and an indicator *A_BLK indicating the physical space of the active block A_BLK.

The control unit 104 includes a microprocessor 122, a read-only memory 124, and a volatile memory 126. The read-only memory 124 and the volatile memory 126 may be integrated with the microprocessor 122 or externally connected to the microprocessor 122. The read-only memory 124 stores read-only code. The microprocessor 122 may operate the flash memory 102 according to the read-only code contained in the read-only memory 124 and the in-system code contained in the ISP block pool 112. When operating the flash memory 102, the microprocessor 122 may dynamically manage a mapping table F2H of the active block A_BLK in the volatile memory 126. Considering the limited space of the volatile memory 126, the mapping table F2H may be quantitatively sealed to the mapping table H2F. In an exemplary embodiment, the partial sealing from the mapping table F2H to the flash memory 102 is also performed according to the reception of a power-off notification (PON). In an exemplary embodiment, the partial sealing from the mapping table F2H to the flash memory 102 is also required after the mapping table F2H is rebuilt by a sudden power-off event recovery (SPOR) procedure. The progress of sealing the mapping table F2H to the mapping table H2F may be recorded in the system information block pool 114 as system information (e.g., indicated by a indicator *seal). When a sudden power-off event occurs, the dynamically managed mapping information that has not been updated to the volatile memory 126 lost. The control unit 104 of the present invention performs a power recovery procedure to deal with this problem. The one-shot programming feature of the active block A_BLK is specifically considered in the power recovery procedure, and thereby the reliability of data is enhanced.

Referring to FIG. 1, when the power recovery procedure starts, the control unit 104 checks the system information block pool 114 to get the indicators *A_BLK and *seal. Accordingly, the active block A_BLK interrupted by the sudden power-off event is found out, and the progress of sealing the mapping table F2H of the active block A_BLK to the mapping table H2F is obtained. From the point indicated by the indicator *seal, the control unit 104 starts scanning the metadata of the active block A_BLK. In the order that the active block A_BLK was filled, the logical addresses of the data stored in the different pages of the active block A_BLK are obtained. The mapping information that was not sealed to the mapping table H2F prior to the sudden power-off event but scanned now is collected to the volatile memory 126 to rebuild the mapping table F2H. When scanning to a space without any metadata, an empty page is found (130 in the figure). The control unit 104 may initialize a final page indicator of the active block A_BLK to point to the former page 132 of the empty page 130. The control unit 104 checks whether the page 132 indicated by the final page indicator is the final page among the N pages written in one round of one-shot programming. In this example, page 132 is not a final page among N pages written in one round of one-shot programming. Thus, the control unit 104 searches back through the active block A_BLK to find the N pages of the former round of one-shot programming and corrects the final page indicator to point to page 134, the final page of the former round of one-shot programming. As for the mapping information collected in the volatile memory 126 by the scanning step of the power recovery procedure, the control unit 104 discards the mapping information 140 of the pages from the next page of page 134 to the page 132.

The one-shot programming relating to the programming of page 132 apparently was interrupted by a sudden power-off event. By correcting the final page indicator of the active block A_BLK to page 134, the pages which might be damaged due to the interrupted one-shot programming is regarded as invalid. As a result, data reliability is guaranteed.

After correcting the final page indicator to page 134, all N pages that are programmed together using one-shot programming containing the newly-recognized final page are checked and corrected. When any of the N pages fails error checking and correction (e.g., UECC occurs), it means that the N pages were damaged because the corresponding round of one-shot programming failed due to the sudden power-off event. The control unit 104 searches back through the active block A_BLK to find a former round of one-shot programming and corrects the final page indicator to point to the final page among the N pages of the former round of one-shot programming. The mapping information corresponding to the failed one-shot programming in the mapping table F2H is discarded.

Figure 2:
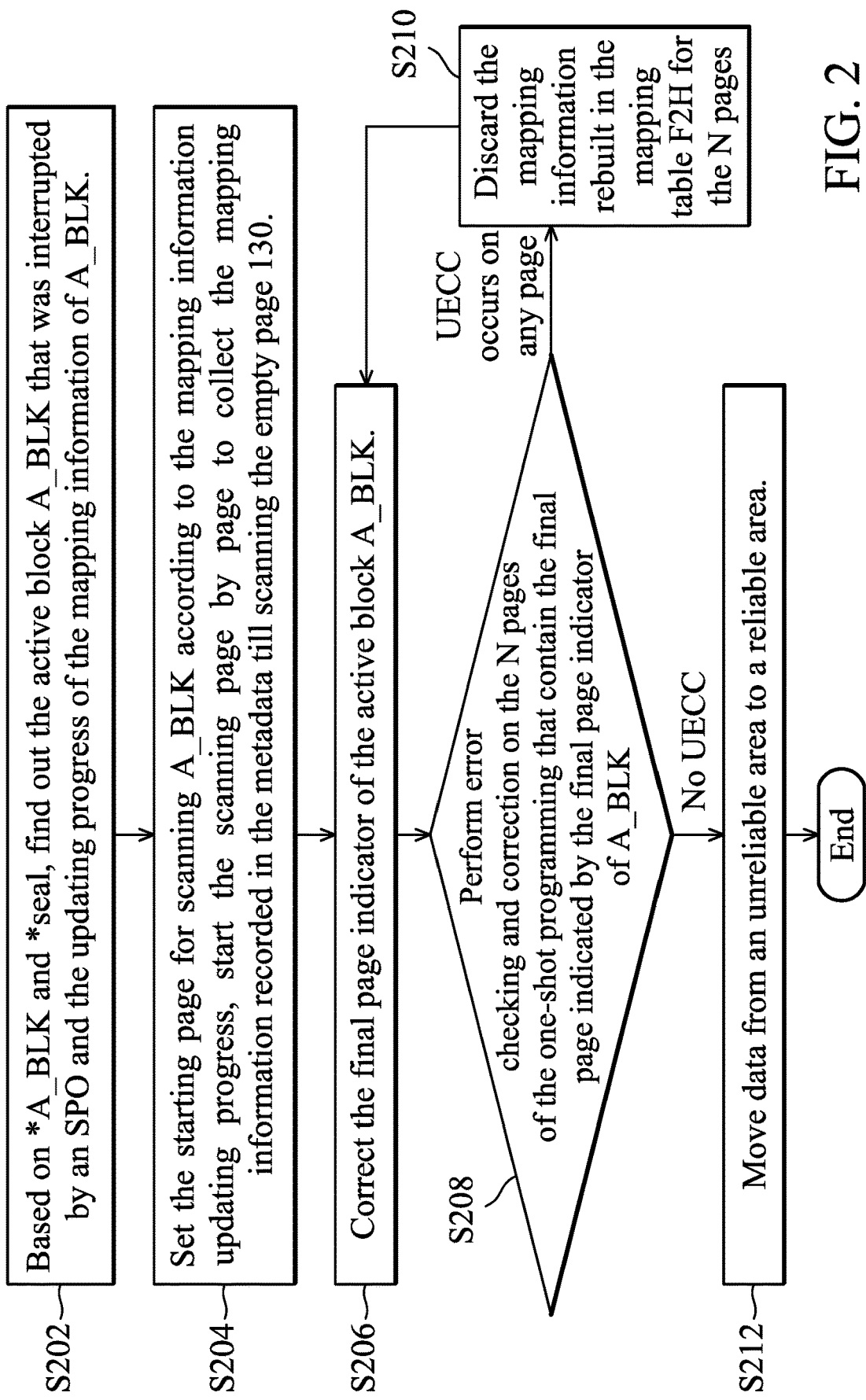
FIG. 2 is a flow chart illustrating a power recovery procedure implemented in accordance with an exemplary embodiment of the present invention, which includes the steps (S208 and S212) for recognizing and moving the unreliable data.

FIG. 2 is a flow chart illustrating a power recovery procedure implemented in accordance with an exemplary embodiment of the present invention, which includes the steps (S208 and S212) for recognizing and moving the unreliable data. The following is discussed with reference to FIG. 1. In step S202, the control unit 104 performs a power recovery procedure. Based on the indicator *A_BLK recorded in the system information block pool 114, the control unit 104 finds the active block A_BLK that was interrupted by a sudden power-off event. According to the indicator *seal contained in the system information block pool 114, the control unit 104 knows the updating progress of the mapping information of the active block A_BLK. In step S204, according to the mapping information updating progress, the control unit 104 sets the starting page for scanning the active block A_BLK, starts the scanning page by page to collect the mapping information (e.g. the logical address corresponding to each page) recorded in the metadata, and rebuilds the mapping table F2H of the active block A_BLK in the volatile memory 126. When scanning to the empty page 130 (containing no metadata), the control unit 104 proceeds to step S206. When the former page 132 of the empty page 130 is not the final page of one round of one-shot programming, the control unit 104 corrects the recognition of the final page of the active block A_BLK in step S206. The final page indicator of the active block A_BLK is corrected to point to the final page among the N pages of a former round of one-shot programming. In step S208, the control unit 104 performs error checking and correction on the N pages of the one-shot programming that contain the final page indicated by the final page indicator of the active block A_BLK. When any page fails to pass the error checking and correction (for example, UECC occurs), the control unit 104 performs step S210 to discard the mapping information rebuilt in the mapping table F2H for the N pages, and performs step S206 again to search the active block A_BLK back. The final page indicator of the active block A_BLK is further moved forward to point to the final page among the N pages of a former round of one-shot programming. When the error checking and correction of step S208 passes, the control unit 104 performs step S212 to move data from an unreliable area to a reliable area.

Figure 3:
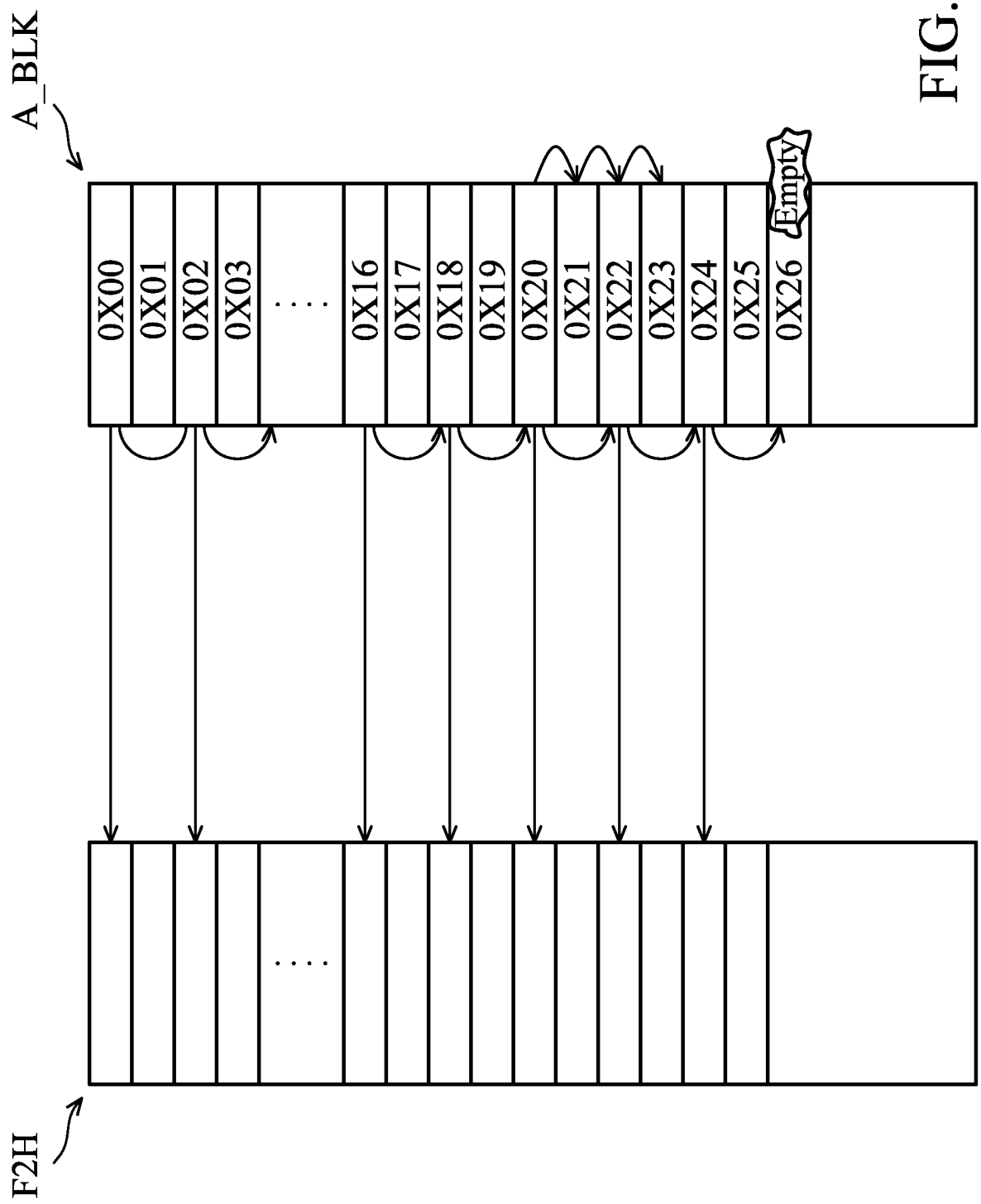
FIG. 3 shows an example associated with the flowchart of FIG. 2.

FIG. 3 shows an example associated with the flowchart of FIG. 2. After the power is restored, double-plane scanning is performed by step S204 to acquire metadata. The metadata of two provided by two planes is acquired together. The logical addresses obtained from the metadata of pages 0x00 and 0x01 are used to rebuild the mapping table F2H by one shot updating. The double-plane scanning of metadata may be performed all the way to the empty page 0x26. When searching to the empty page 0x26, the rebuilt mapping table F2H contains the searched mapping information of pages 0x24 and 0x25. In this exemplary embodiment, MLCs are used to store data in a double-plane mode. The active block A_BLK receives four pages of data at a time. The former page 0x25 of the empty page 0x26 corresponds to one round of one-shot programming of pages 0x24~0x27 and, obviously, is not the final page 0x27 of the round of one-shot programming. Therefore, step S206 is performed. The final page indicator of the active block A_BLK is corrected to page 0x23, the final page 0x23 of the one-shot programming of pages 0x20~0x23. According to step S208, the control unit 104 reads from page 0x20 to get the four pages 0x20~0x23. The four pages 0x20~0x23 each is checked and corrected based on the checking code (e.g. ECC code) acquired from the corresponding metadata. When UECC occurs, the four pages 0x20~0x23 and the mapping information acquired from the metadata of the four pages 0x20~0x23 are entirely discarded (step S210). The final page indicator of the active block A_BLK is corrected to page 0x19, which is the final page of another former round of one-shot programming. Even if it is determined in step S208 that no UECC occurs, data movement is performed by step S212 due to unreliable problems. For example, although pages 0x20~0x23 are still readable, they are unreliable and may be damaged in the near future and step S212 is performed to move them to another space.

There are a variety of exceptions for step S212. The data movement may be omitted. In an exemplary embodiment, the round of one-shot programming passing the error checking and correction is not followed by an empty page. That means that the sudden power-off event occurred when the round of one-shot programming passing the error checking and correction has finished. Data movement of step S212 for data reliability is not required. Referring to FIG. 3, the final page indicator of the active block A_BLK has been corrected to point to page 0X23 and the round of one-shot programming associated with page 0X23 passes the error checking and correction. Because the next page 0X24 is not an empty page, pages 0x20~0x23 are reliable. Data movement of step S212 for data reliability is not required.

Figure 4:
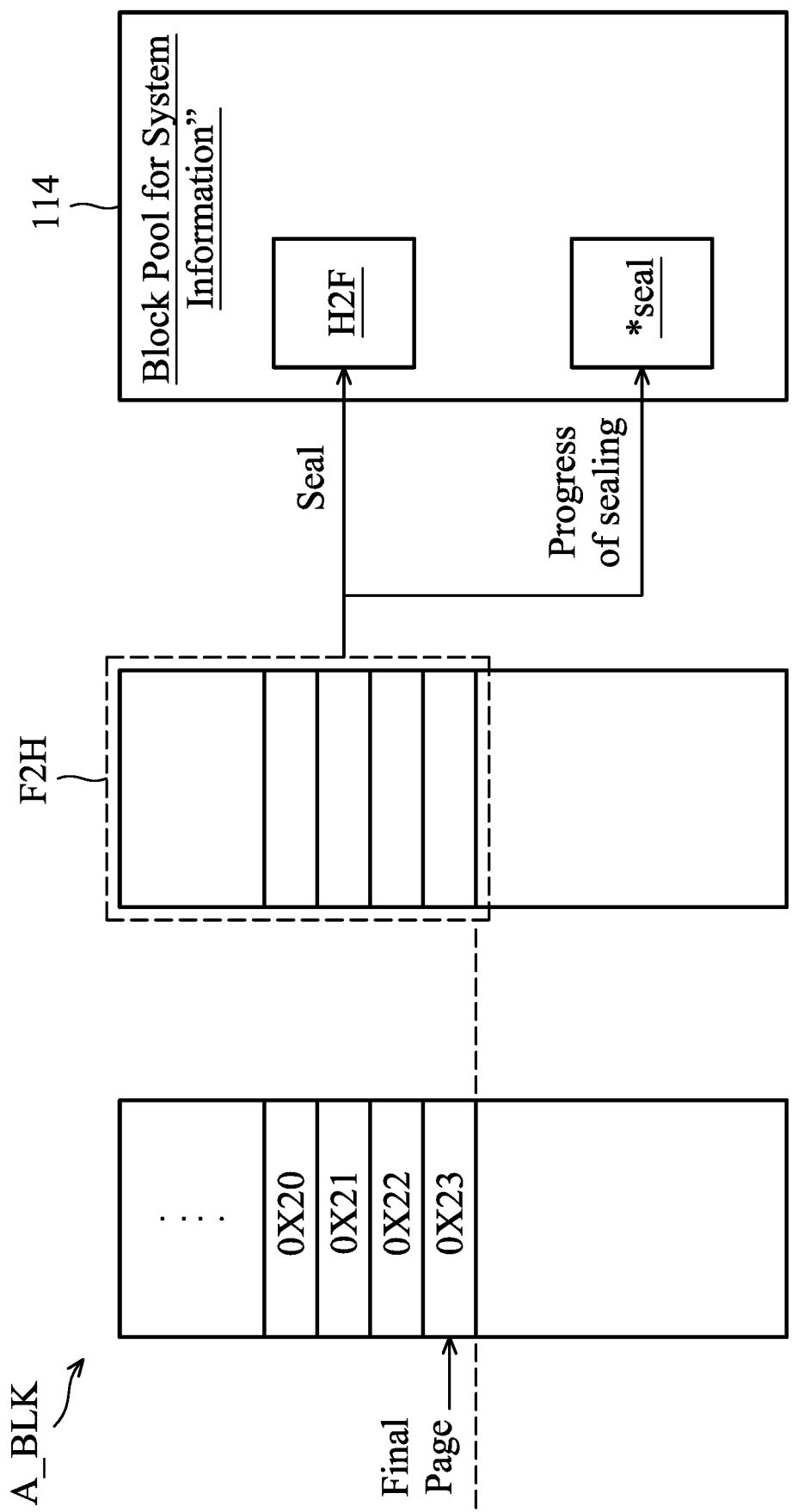
FIG. 4 is another example regarding an exception to the unreliable data moving step S212.

FIG. 4 is another example regarding an exception to the unreliable data moving step S212. For a round of one-shot programming passing the error checking and correction with the mapping information already sealed in the non-volatile memory (has been updated from the mapping table F2H to the mapping table H2F), it means that the round of one-shot programming was not damaged by the sudden power-off event. Data movement of step S212 for data reliability is not required. Referring to FIG. 4, prior to the sudden power-off event, the sealing of mapping information (from F2H to H2F, with an indicator *seal indicating the progress of sealing) has proceeded to page 0x23. As a result, it is determined that the sudden power-off event did not occur during the one-shot programming on pages 0x20~0x23. The pages 0x20~0x23 are reliable. Data movement of step S212 for data reliability is not required.

Figure 5:
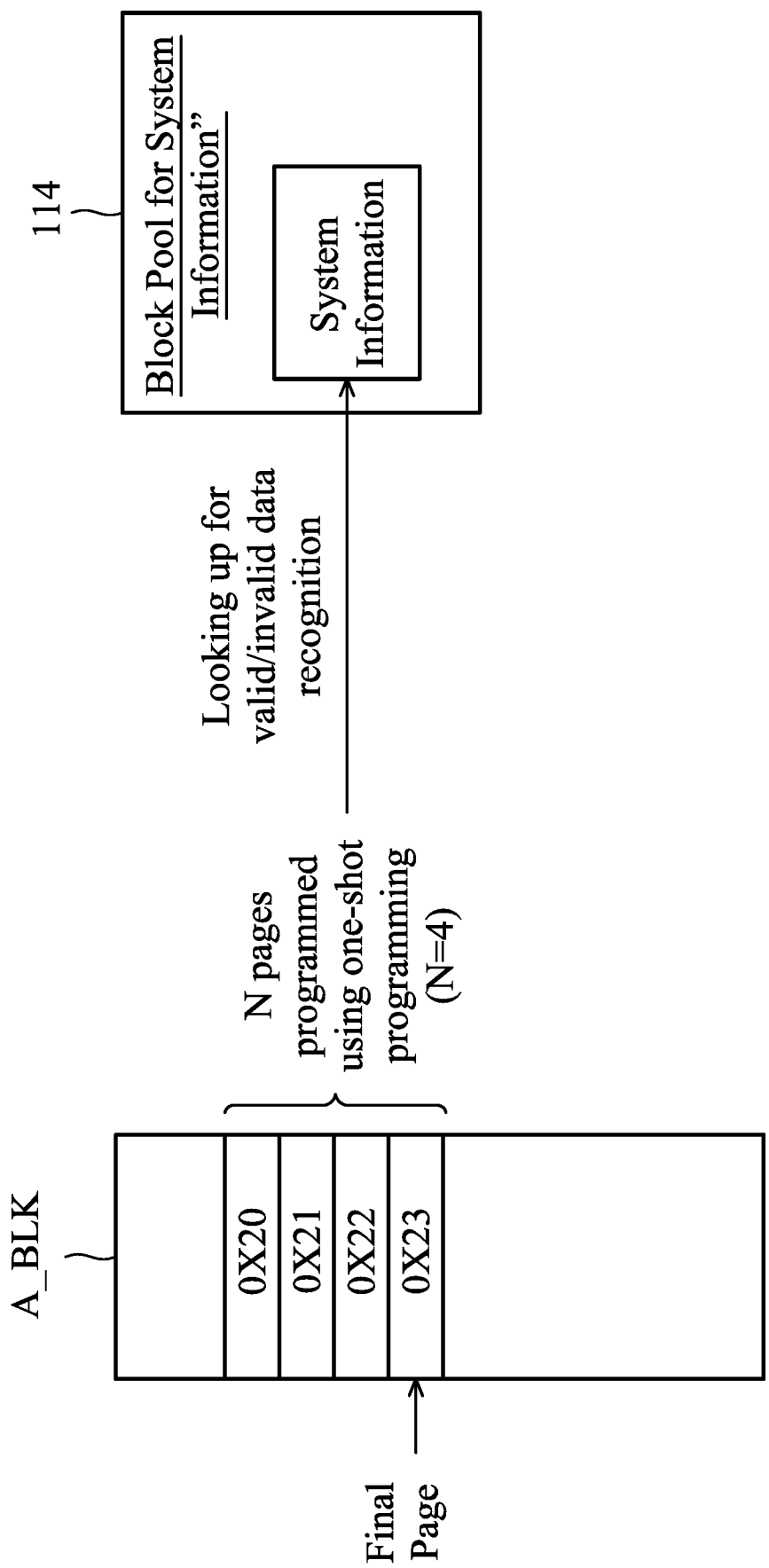
FIG. 5 is another example regarding an exception to the unreliable data moving step S212.

FIG. 5 is another example regarding an exception to the unreliable data moving step S212. For a round of one-shot programming passing the error checking and correction with invalid mapping information (for example, has allegedly being erased or updated), data movement of step S212 for data reliability is not required. FIG. 5 shows that the final page indicator of the active block A_BLK points to page 0x23 and the pages 0x20~0x23 pass the error checking and correction. However, the query result shows that pages 0x20~0x23 are invalid. Data movement of step S212 for data reliability is not required. Whether the data is valid or invalid is judged by querying the system information stored in the system information block pool 214. In an exemplary embodiment, the non-volatile stored mapping tables F2H and H2F may be queried as the system information used to judge whether the data is valid or invalid. The logical block address LBA obtained from the mapping table F2H is used to check the mapping table H2F. When the mapping table H2F shows that the logical block address LBA maps to the correct physical space, the checked data is valid, otherwise, the checked data is invalid. Alternatively, the control unit 104 may organize system information on the volatile memory 126 during the power recovery process, to help determine whether the data is valid or not.

In an exemplary embodiment, after determining the final page indicator, the control unit 104 determines whether the data stored in the space indicated by the final page indicator is still valid, followed by an empty page, and corresponding to a round of one-shot programming with non-sealed mapping information. When determining that the data stored in the space indicated by the final page indicator is still valid, followed by an empty page, and corresponding to a round of one-shot programming with non-sealed mapping information, the control unit 104 moves the N pages of the checked round of one-shot programming to a reliable space.

In an exemplary embodiment, sequential data and random data are written to separate blocks, e.g., labeled C0 and C1, respectively. The control unit 104 repairs the data blocks C0 and C1 both during the power recovery procedure. In an exemplary embodiment, when finishing using the block C0/C1 to receive data, the control unit 104 allocates new block C2/C3 to receive sequential/random data. The spare time intervals between the operations of block C2/C3 may be utilized to seal the mapping table F2H of the block C0/C1 to the mapping table H2F. When the control unit 104 knows that block C2/C3 exists from the system information of the block pool 214 in the power recovery procedure, the block C2/C3 has to be scanned by the scanning step S204, too. When not obtaining block C2/C3, the control unit 104 rebuilds the mapping information based on the scanning on the block C0/C1.

Data reliability judgment performed in a power recovery procedure of a data storage device based on the size of one round of one-shot programming (N pages) is considered within the scope of the present invention. Based on the aforementioned technical content, the present invention further relates to a non-volatile memory operation method.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a non-volatile memory, programmed using one-shot programming, wherein N pages are programmed in one round of one-shot programming and N is a number greater than one; and
a control unit, correcting a final page indicator of an active block of the non-volatile memory in a power recovery procedure to cope with a sudden power-off event, to point the final page indicator to a final page among N pages of one round of one-shot programming programmed prior to the sudden power-off event,
wherein the control unit performs error checking and correction on N pages of one round of one-shot programming that include the final page indicated by the final page indicator and, when the error checking and correction fails, the control unit corrects the final page indicator to a final page among N pages of a former round of one-shot programming.

2. The data storage device as claimed in claim 1, wherein:
after determining a final page indicator, the control unit determines whether the N pages of one round of one-shot programming that include the final page indicated by the final page indicator are affected by the sudden power-off event and moves the affected N pages to a reliable area.

3. The data storage device as claimed in claim 2, wherein:
when the final page indicated by the final page indicator is not followed by an empty page, the control unit determines that the N pages of one round of one-shot programming that include the final page indicated by the final page indicator are not affected by the sudden power-off event and no affected N pages need to be moved to a reliable area.

4. The data storage device as claimed in claim 2, wherein:
when mapping information of the N pages of one round of one-shot programming that include the final page indicated by the final page indicator has been sealed, the control unit determines that the N pages of one round of one-shot programming that include the final page indicated by the final page indicator are not affected by the sudden power-off event and no affected N pages need to be moved to a reliable area.

5. The data storage device as claimed in claim 1, wherein:
after determining a final page indicator, the control unit determines whether the N pages of one round of one-shot programming that include the final page indicated by the final page indicator has been invalidated by updated data or data movement to prevent the movement of invalid data.

6. The data storage device as claimed in claim 1, wherein:
after determining a final page indicator, the control unit determines whether the final page indicated by the final page indicator is valid and is followed by an empty page, and whether the mapping information of the N pages of one round of one-shot programming that include the final page indicated by the final page indicator has been sealed; and
when determining that the final page indicated by the final page indicator is valid and is followed by an empty page, and the mapping information of the N pages of one round of one-shot programming that include the final page indicated by the final page indicator has not been sealed, the control unit moves the N pages of one round of one-shot programming that include the final page indicated by the final page indicator to a reliable area.

7. The data storage device as claimed in claim 1, wherein:
according to the power recovery procedure, the control unit scans the active block in the order of in which the active block was filled to check metadata of each page, determines a page having no metadata as a first empty page, and initializes the final page indicator to point to a former page of the first empty page.

8. The data storage device as claimed in claim 7, wherein:
when checking the metadata of each page, the control unit rebuilds a mapping table F2H of the active block; and
after determining a final page indicator, the control unit invalidates mapping information rebuilt in the mapping table F2H for a space that follows the final page that is indicated by the final page indicator.

9. The data storage device as claimed in claim 1, wherein:
data sharing a storage cell is programmed together using one-shot programming.

10. A method for operating a non-volatile memory, comprising:
programming a non-volatile memory using one-shot programming, wherein N pages are programmed in one round of one-shot programming and N is a number greater than one;
correcting a final page indicator of an active block of the non-volatile memory in a power recovery procedure to cope with a sudden power-off event, to point the final page indicator to a final page among N pages of one round of one-shot programming programmed prior to the sudden power-off event;
performing error checking and correction on N pages of one round of one-shot programming that include the final page indicated by the final page indicator; and
when the error checking and correction fails, correcting the final page indicator to a final page among N pages of a former round of one-shot programming.

11. The method as claimed in claim 10, comprising:
after determining a final page indicator, further determining whether the N pages of one round of one-shot programming that include the final page indicated by the final page indicator are affected by the sudden power-off event and moving the affected N pages to a reliable area.

12. The method as claimed in claim 11, further comprising:
when the final page indicated by the final page indicator is not followed by an empty page, determining that the N pages of one round of one-shot programming that include the final page indicated by the final page indicator are not affected by the sudden power-off event and no affected N pages need to be moved to a reliable area.

13. The method as claimed in claim 11, further comprising:
when mapping information of the N pages of one round of one-shot programming that include the final page indicated by the final page indicator has been sealed, determining that the N pages of one round of one-shot programming that include the final page indicated by the final page indicator are not affected by the sudden power-off event and no affected N pages need to be moved to a reliable area.

14. The method as claimed in claim 10, comprising:
after determining a final page indicator, further determining whether the N pages of one round of one-shot programming that include the final page indicated by the final page indicator has been invalidated by updated data or data movement to prevent the movement of invalid data.

15. The method as claimed in claim 10, comprising:
after determining a final page indicator, further determining whether the final page indicated by the final page indicator is valid and is followed by an empty page, and whether the mapping information of the N pages of one round of one-shot programming that include the final page indicated by the final page indicator has been sealed; and
when determining that the final page indicated by the final page indicator is valid and is followed by an empty page, and the mapping information of the N pages of one round of one-shot programming that include the final page indicated by the final page indicator has not been sealed, moving the N pages of one round of one-shot programming that include the final page indicated by the final page indicator to a reliable area.

16. The method as claimed in claim 10, comprising:
according to the power recovery procedure, further scanning the active block in the order of in which the active block was filled to check the metadata of each page, designating a page having no metadata as a first empty page, and initializing the final page indicator to point to a former page of the first empty page.

17. The method as claimed in claim 16, further comprising:
rebuilding a mapping table F2H of the active block when checking the metadata of each page; and
after determining a final page indicator, invalidating the mapping information rebuilt in the mapping table F2H for a space that follows the final page that was indicated by the final page indicator.

18. The method as claimed in claim 10, wherein:
data sharing a storage cell is programmed together using one-shot programming.

* * * * *